(12) United States Patent
Yen et al.

(10) Patent No.: US 10,714,441 B2
(45) Date of Patent: Jul. 14, 2020

(54) FILTER AND CAPACITOR USING REDISTRIBUTION LAYER AND MICRO BUMP LAYER

(71) Applicant: Taiwan Semiconductor Manufacturing Company, Ltd., Hsinchu (TW)

(72) Inventors: Hsiao-Tsung Yen, Tainan (TW); Jhe-Ching Lu, Tainan (TW); Yu-Ling Lin, Taipei (TW); Chin-Wei Kuo, Zhubei (TW); Min-Chie Jeng, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 11 days.

(21) Appl. No.: 15/946,970

(22) Filed: Apr. 6, 2018

(65) Prior Publication Data
US 2018/0233471 A1 Aug. 16, 2018

Related U.S. Application Data

(60) Continuation of application No. 15/238,520, filed on Aug. 16, 2016, now Pat. No. 9,960,133, which is a
(Continued)

(51) Int. Cl.
*H01L 23/00* (2006.01)
*H01L 25/065* (2006.01)
(Continued)

(52) U.S. Cl.
CPC ............. *H01L 24/11* (2013.01); *H01L 24/10* (2013.01); *H01L 24/15* (2013.01); *H01L 24/17* (2013.01); *H01L 25/0657* (2013.01); *H01L 25/18* (2013.01); *H01L 25/50* (2013.01); *H01L 2224/023* (2013.01); *H01L 2224/03* (2013.01);
(Continued)

(58) Field of Classification Search
CPC ...................... H01L 24/17; H01L 2224/17104
See application file for complete search history.

(56) References Cited

U.S. PATENT DOCUMENTS 5,317,291 A * 5/1994 Podell ................. H01P 1/20336
333/203
5,477,086 A 12/1995 Rostoker et al.
(Continued)

FOREIGN PATENT DOCUMENTS

WO 2012125237 A2 9/2012

OTHER PUBLICATIONS

Nomiyama, You, et al., "Low-Impedance and High-Q Transmission Line for mmw VCO," Department of Physical Electronics, Tokyo Institute of Technology, 2009 IEEE, 4 pages.
(Continued)

*Primary Examiner* — Amar Movva
(74) *Attorney, Agent, or Firm* — Slater Matsil, LLP

(57) ABSTRACT

An integrated circuit package includes a die. An electrically conductive layer comprises a redistribution layer (RDL) in the die, or a micro-bump layer above the die, or both. The micro bump layer comprises at least one micro-bump line. A filter comprises the electrically conductive layer. A capacitor comprises an electrode formed in the electrically conductive layer.

20 Claims, 6 Drawing Sheets

Related U.S. Application Data division of application No. 13/791,019, filed on Mar. 8, 2013, now Pat. No. 9,449,945.

(51) Int. Cl.
*H01L 25/18* (2006.01)
*H01L 25/00* (2006.01)

(52) U.S. Cl.
CPC ............... *H01L 2224/13147* (2013.01); *H01L 2224/17104* (2013.01); *H01L 2224/81815* (2013.01); *H01L 2924/0002* (2013.01)

(56) References Cited

U.S. PATENT DOCUMENTS

| | | |
|---|---|---|
| 6,614,325 B1 | 9/2003 | Kocin |
| 7,145,411 B1 | 12/2006 | Blair et al. |
| 8,358,009 B2 | 1/2013 | Furumiya et al. |
| 8,610,247 B2 | 12/2013 | Yen et al. |
| 2004/0155728 A1 | 8/2004 | Cheung et al. |
| 2006/0157845 A1 | 7/2006 | Terui |
| 2007/0241844 A1 | 10/2007 | Kim et al. |
| 2008/0029886 A1 | 2/2008 | Cotte et al. |
| 2009/0249610 A1 | 10/2009 | Ding et al. |
| 2010/0246152 A1* | 9/2010 | Lin ..................... H01L 21/563 361/783 |
| 2011/0210444 A1 | 9/2011 | Jeng et al. |
| 2011/0285007 A1* | 11/2011 | Chi ..................... H01L 21/4846 257/686 |
| 2011/0291232 A1 | 12/2011 | Yen et al. |
| 2012/0175771 A1 | 7/2012 | Huang et al. |
| 2013/0001795 A1 | 1/2013 | Lim et al. |
| 2013/0105973 A1 | 5/2013 | Gan et al. |
| 2013/0168809 A1 | 7/2013 | Yen et al. |
| 2013/0187266 A1 | 7/2013 | Chen |
| 2013/0336082 A1 | 12/2013 | Khawshe et al. |
| 2014/0008773 A1 | 1/2014 | Yen et al. |
| 2014/0054802 A1 | 2/2014 | Shim et al. |
| 2014/0070404 A1 | 3/2014 | Sheu et al. |
| 2014/0084415 A1 | 3/2014 | Lin et al. |
| 2014/0097930 A1 | 4/2014 | Yen et al. |
| 2014/0203397 A1 | 7/2014 | Yen et al. |
| 2015/0031184 A1 | 1/2015 | Yen et al. |

OTHER PUBLICATIONS

Veenstra, H. et al., "60 GHz VCOs with Trasmission Line Resonator in a 0.25 um SiGe BiCMOS Technology," Philips Research, Eindhove, The Netherlands, IEEE Radio Frequency INtegrated Circuits Symposium, 2008, pp. 119-122.

* cited by examiner

FILTER AND CAPACITOR USING REDISTRIBUTION LAYER AND MICRO BUMP LAYER

The present application is a continuation of U.S. application Ser. No. 15/238,520, entitled "Filter and Capacitor Using Redistribution Layer and Micro Bump Layer," filed on Aug. 16, 2016, which is a divisional of U.S. application Ser. No. 13/791,019, entitled "Filter and Capacitor Using Redistribution Layer and Micro Bump Layer," filed on Mar. 8, 2013, now U.S. Pat. No. 9,449,945 issued Sep. 20, 2016, all of which are incorporated herein by reference.

CROSS-REFERENCE TO RELATED APPLICATIONS

The present application is related to U.S. application Ser. No. 13/747,861, entitled "Methods and Apparatus for Inductors and Transformers in Packages," filed on 23 Jan. 2013, now U.S. Pat. No. 8,896,094 issued Nov. 25, 2014, which is incorporated herein by reference.

TECHNICAL FIELD

The present disclosure relates generally to an integrated circuit and more particularly to a filter and a capacitor.

BACKGROUND

Some integrated circuit filters or capacitors implemented in a chip use relatively large chip area and have limited performance. Thus, integrated circuit filters and capacitors with better performance that save the chip area are desirable.

BRIEF DESCRIPTION OF THE DRAWINGS

Reference is now made to the following descriptions taken in conjunction with the accompanying drawings, in which.

DETAILED DESCRIPTION

Figure 1A:
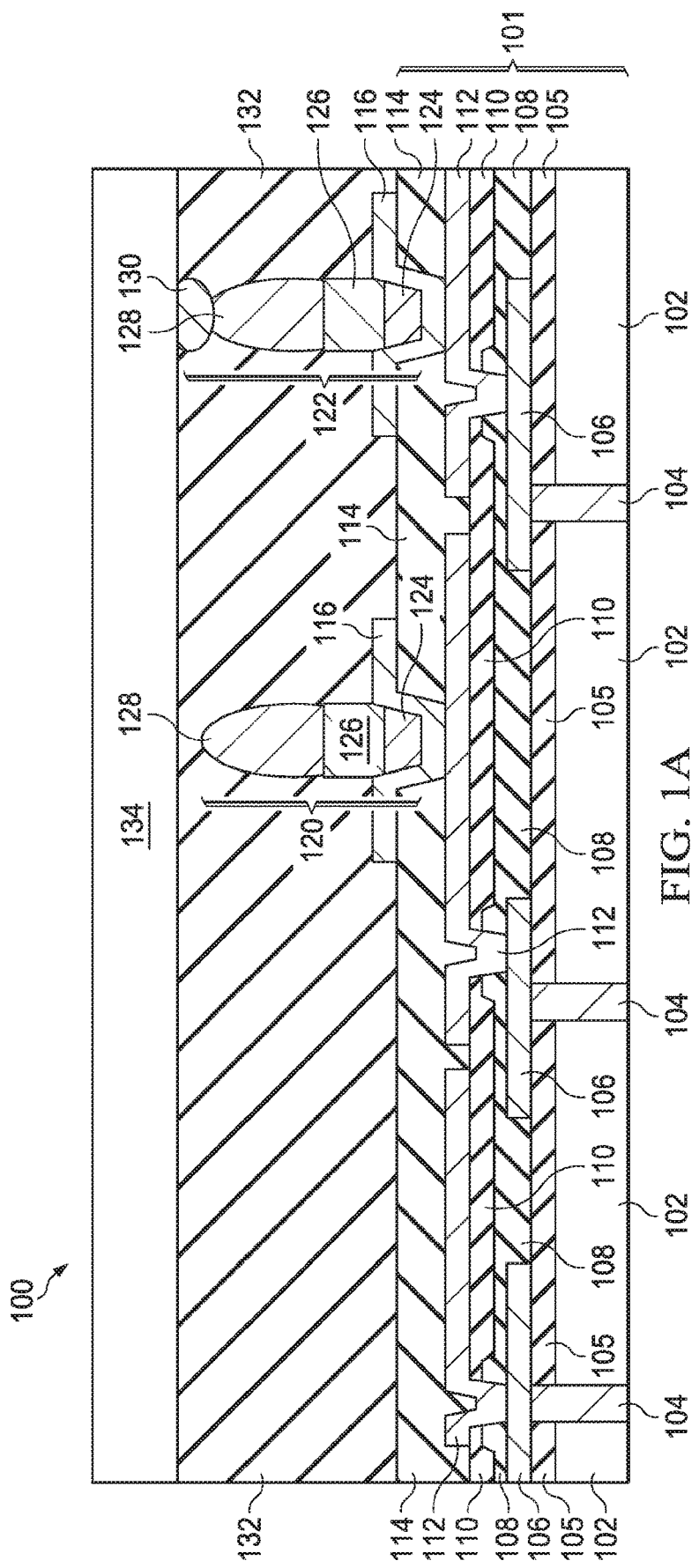
FIG. 1A is an exemplary integrated circuit package that may include an exemplary filter and/or capacitor according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1A is an exemplary integrated circuit (IC) package 100 that may include an exemplary filter and/or capacitor according to some embodiments. The package 100 includes a bottom die 101. The bottom die 101 may comprise: a substrate 102 with vias (or through vias) 104, a dielectric layer 105, a metal layer 106 (e.g., interconnect, contact pad, etc.), a passivation layer 108, an insulator layer 110, a redistribution layer (RDL) 112, another insulator layer 114, and an under bump metal (UBM) layer comprising UBM pads 116 covering openings of the insulator layer 114.

A micro-bump layer may be formed above the bottom die 101. The micro-bump layer comprises micro-bump line 120 and 122, placed on the UBM pads 116, which are further connected to the RDL 112 inside the bottom die 101. The RDL 112, the micro-bump line 120 and 122, and/or the UBM pads 116 can be parts of a filter 150 shown in FIG. 1B in a top view.

A top die 134 may be placed above the bottom die 101, connected to the micro-bump line 122 by a connector 130. In some embodiments, RDL 112, metal layer 106, vias 104, and/or UBM pads 116 can be also present in the top die 134. An underfill 132 may fill the gap between the bottom die 101 and the top die 134, covering the micro-bump lines 120 and 122, and the connector 130. Each of these structures is discussed in greater detail in the following paragraphs.

The bottom die 101 may be an interposer comprising a substrate 102, with through vias 104, the metal layer (or contact pads) 106, passivation layer 108, insulator layer 110, RDL 112, and UBM pads 116. Alternatively, the bottom die 101 may be a part of a chip or an integrated circuit (IC) die, which may be a back or front side of a die. If the bottom die 101 is a part of a die, the top die 134 is placed on the IC bottom die 101, which will be further coupled to an interposer by connectors such as micro-bumps to form a package such as a 3 DIC package.

If the bottom die 101 is the backside of a die, then the package 100 is formed by face-to-back stacking of the dies 101 and 134 in some embodiments. If the bottom die 101 is the front side of a die, then the package 100 is formed by face-to-face stacking of the dies 101 and 134 in some embodiments. Alternatively, the bottom die 101 may be a package substrate without through vias, some or all of the layers described above. These embodiments and any other suitable embodiments may alternatively be used and are fully intended to be included within the scope of the present embodiments.

The substrate 102 for the bottom die 101 may be, e.g., a silicon substrate, doped or undoped, or an active layer of a silicon-on-insulator (SOI) substrate, used to provide support for the bottom die 101 in some embodiments. Also, the substrate 102 may alternatively be a glass substrate, a ceramic substrate, a polymer substrate, or any other substrate that may provide a suitable protection, support, and/or interconnection functionality. These and any other suitable materials may alternatively be used for the substrate 102.

There may be a plurality of active or passive components, such as transistors, capacitors, resistors, and the like, formed on the substrate 102, which are not shown in FIG. 1A. As one of ordinary skill in the art will recognize, a wide variety of active or passive components may be used to generate the desired structural and functional requirements of the design for the bottom die 101.

The vias 104 may be formed through the substrate 102. The vias 104 may be formed by applying and developing a suitable photoresist, and then etching the substrate 102 to generate via openings. In some embodiments, the depth may be between about 1 μm and about 700 μm below the surface on the substrate 102. The openings for the vias 104 may have a diameter of from about 0.5 μm to about 100 μm.

Then the openings for the vias 104 may be filled by a barrier layer and a conductive material, using a process such as chemical vapor deposition (CVD) process, plasma enhanced CVD (PECVD), sputtering or metal organic chemical vapor deposition (MOCVD). Excessive barrier layer and excessive conductive material outside of the openings for the vias 104 may be removed through a grinding process such as chemical mechanical polishing (CMP). Then a thinning of the second side of the substrate 102 may be performed by a planarization process such as CMP or etching, in order to expose the openings for the vias 104 and to form the vias 104. If the vias 104 are through vias, they are formed with the conductive material that extends through the substrate 102 in FIG. 1A.

The dielectric layer 105, such as silicon dioxide, is formed over the substrate 102 in some embodiments. The metal layer 106 is formed over the dielectric layer 105 and the substrate 102. Even though one dielectric layer 105 and one metal layer 106 are shown in FIG. 1A, multiple metal layers such as 106 may be formed with alternating dielectric layers (e.g., in via layers) by any suitable process (such as deposition, damascene, dual damascene, etc.). The metal layer 106 may comprise aluminum (Al), copper (Cu), tin (Sn), nickel (Ni), gold (Au), silver (Ag), tungsten (W) or other electrically conductive material. The deposition of metal layer 106 uses an electrolytic plating, sputtering, physical vapor deposition (PVD), or electroless plating process. The size, shape, and location of the metal layer 106 are only for illustration purposes and are not limiting.

The passivation layer 108 may be formed over the surface of the substrate 102 and above the metal layer 106 for structural support and physical isolation. The passivation layer 108 may be made with silicon nitride (SiN), silicon dioxide (SiO2), silicon oxynitride (SiON), polyimide (PI), benzocyclobutene (BCB), polybenzoxazole (PBO), or other insulating material. Openings of the passivation layer 108 may be made by removing a portion of the passivation layer 108 using a mask-defined photoresist etching process to expose the metal layer 106. The size, shape, and location of the openings made are only for illustration purposes and are not limiting.

The insulator layer 110, e.g., silicon dioxide or polymer, may be formed over the passivation layer 108 and over the passivation layer opening to cover the metal layer 106. An opening of the insulator layer 110 may be formed to expose the metal layer 106. The openings of the insulator layer 110 may be made by removing a portion of the insulator layer 110 using a mask-defined photoresist etching process to expose the metal layer 106. The size, shape, and location of the opening made are only for illustration purposes and are not limiting.

The RDL 112 may be formed following the contour of the insulator layer 110. The RDL 112 may be continuous and connect to the exposed metal layer 106. While illustrated in FIG. 1A with a single layer of dielectric and interconnects, the RDL 112 may be formed of multiple alternating layers of insulator layer (e.g., dielectric layer) and conductive layer (e.g., metal layer) for interconnects and may be formed through any suitable process (such as deposition, damascene, dual damascene, etc.).

The RDL 112 may comprise Al, Al alloy, Cu, Cu alloy, or any other suitable material. The RDL 112 can be made by an electrolytic plating, sputter, PVD, or electroless plating process. The RDL 112 can be made with a single layer, or multiple layers using an adhesion layer of Ti, TiW, TaN, Ta, Ni, Ferrites, Fe, Cr, or ferromagnetic material such as Fe—Co—Al—N, for example. The bottom die 101 may comprise a number of RDL layers to form a network of inter-level interconnects which may electrically connect to the metal layer 106 in some embodiments.

Another insulator layer 114 may be formed on the RDL 112, which may be the top layer and surface layer of the bottom die 101. Openings of the insulator layer 114 may be formed to expose the RDL 112. The openings of the insulator layer 114 may be made by removing a portion of the insulator layer 114 using a mask-defined photoresist etching process to expose the RDL 112. The size, shape, and location of the opening made are only for illustration purposes and are not limiting.

The insulator layer 114 may comprise dielectric materials, e.g., silicon dioxide, a polymer, e.g., an epoxy, polyimide, benzocyclobutene (BCB), or polybenzoxazole (PBO), or any other suitable material. Formation methods include spin coating or any other methods known in the art. The thickness of the insulator layer 114 may be from about 5 μm to about 30 μm in some embodiments. The dimensions recited throughout the description are merely examples, and can be different in other embodiments.

An UBM layer comprising UBM pads 116 may be formed around the openings of the insulator layer 114 and connected to the RDL 112. The UBM pads 116 may be formed of copper or copper alloys, which may include silver, chromium, nickel, tin, gold, and any combinations thereof. Additional layers, such as a nickel layer, a lead-free pre-solder layer, or the combinations thereof, may be formed over the copper layer. The UBM pads 116 may have a thickness of from about 1 μm to about 20 μm in some embodiments. The UBM pads 116 may be also referred as contact pads.

The connector 130 may be contact bumps such as microbumps or controlled collapse chip connection (C4) bumps and may comprise a material such as tin, or other suitable materials, such as silver or copper. In some embodiments using tin solder bumps, the connector 130 may be formed by initially forming a layer of tin through any suitable method such as evaporation, electroplating, printing, solder transfer, ball placement, etc., to a thickness of 20 μm to 200 μm, such as about 100 μm. Then a reflow may be performed in order to shape the material into the desired bump shape.

The underfill 132 may be used between the top die 134 and the bottom die 101 to strengthen the attachment of the top die 134 to the bottom die 101 and to prevent the thermal stresses from breaking the connections between the top die 134 and the bottom die 101. Generally, the material for the underfill 132, such as organic resin, is selected to control the coefficient of thermal expansion and the shrinkage of underfill 132. In some embodiments, liquid organic resin is applied that flows into the gap between the top die 134 and the surface of the bottom die 101, which subsequently cures to control the shrinkage that occurs in underfill 132 during curing.

In some embodiments, the height of the micro-bump layer may range from about 10 μm to about 50 μm, e.g., about 27 μm. The micro-bump line 122 may comprise a solder bump 128 formed above a Cu layer 124. An optional Ni layer 126 may be in between the solder bump 128 and the Cu layer 124. The solder bump 128 may comprise an electrically conductive solder material, e.g., Sn, Ni, Au, Ag, Cu, Bi, W, Fe, Ferrite, an alloy or combination thereof, or any other suitable material.

For example, the micro-bump line 122 may be formed by initially forming a Cu layer 124 through methods such as sputtering, evaporation, electroplating, printing, solder transfer, or ball placement, to a thickness of, e.g., about 15 μm, followed by forming a Ni layer 126, and finally followed by forming a solder layer 128 such as lead-free solder SnAg.

Then a reflow is performed in order to shape the solder layer 128 into the desired bump shape shown as the solder bump 128. Any suitable method of producing the micro-bump line 122 may be utilized. For example, the micro-bump line 122 may be manufactured using a Controlled Collapse Chip Connection New Process (C4NP).

The micro-bump line 122 may be placed on the UBM pad (or contact pad) 116 of the bottom die 101. The UBM pad 116 may fill an opening or partially filling an opening of an insulator layer 114, e.g., polymer. The UBM pad 116 may be further connected to the RDL 112 or the metal layer 106 in the bottom die 101. The micro-bump line 122 may have a height from about 10 μm to about 50 μm in some embodiments and can be smaller or bigger in some other embodiments.

The micro-bump line 120 may be made of substantially similar materials as the materials used for the micro-bump line 122. The micro-bump line 120 may be placed on UBM pads 116 of the bottom die 101, which are further connected to the RDLs 112 and metal layer 106 in the bottom die 101. The RDLs 112, the micro-bump line 120, and/or the UBM pads can be parts of a filter (such as the filter shown in FIG. 1B) or a capacitor (such as the capacitor shown in FIG. 4A).

By using the RDL 112, or micro bump line 120 and/or 122 to implement a filter or a capacitor, the filter or the capacitor can have the lower resistance from the thicker layer(s), compared to a thinner metal layer in a die such as 101. Also, no chip area or reduced chip area in the die (e.g., below RDL 112) is used to implement the filter or the capacitor. Examples are described below with performance comparison in FIG. 3 and FIG. 5A.

Figure 1B:
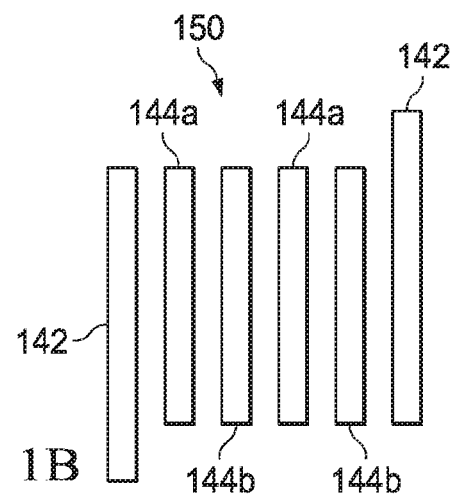
FIG. 1B is an exemplary filter layout that may be implemented in the exemplary integrated circuit package in FIG. 1A.

FIG. 1B is an exemplary (comb line) filter layout that may be implemented in the exemplary integrated circuit package in FIG. 1A. In FIG. 1B, the filter 150 is a comb line filter having two port strips 142 and middle strips 144a and 144b. Each of the strips 142, 144a, and 144b of the filter 150 can be implemented with the conductive layer of RDL 112 and/or the micro-bump line 120 and 122. For example, the strips 142, 144a, and 144b can be implemented as a combination of the RDL 112 and the micro bump line 120 for each strip. Any other shapes of the strips (e.g., L-shape, M-shape, curved shape, etc.) can be used for a filter and the filter layout can be designed by any known methods in the art.

In some embodiments, the strips 142, 144a, and 144b of the comb line filter 150 has a width ranging from 2 μm to 50 μm with spacing in between each other in the same range. In some embodiments, the number of strips 144a and 144b can be more or less than shown in FIG. 1B and the total width of the comb line filter 150 is about 50 μm in one example.

The micro-bump line 120 may be of a rectangle shape with a width from around 10 μm to about 100 μm. The micro-bump line 120 may have a narrow, wide, or tapered shape. The body of the micro-bump line 120 may be of a substantially constant thickness. The micro-bump line 120 may be of other shapes such as a circle, an octagon, a rectangle, an elongated hexagon with two trapezoids on opposite ends of the elongated hexagon, an oval, a diamond, in top views.

The bottom die 101 described is merely an example. There may be many other variations different from what is illustrated in FIG. 1A and described above. For example, the insulator layer 110 may not present, or there may be multiple passivation layers 108 in some embodiments. The bottom die 101 may have multiple RDL's in some of the embodiments as shown in FIG. 2A.

Figure 2B:
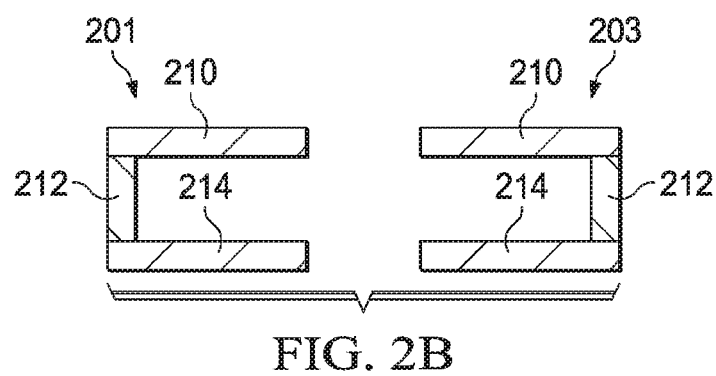
FIG. 2B is a cross section of an exemplary filter strip in FIG. 2A using multiple layers that may be implemented in the exemplary integrated circuit package in FIG. 2A.
Figure 2A:
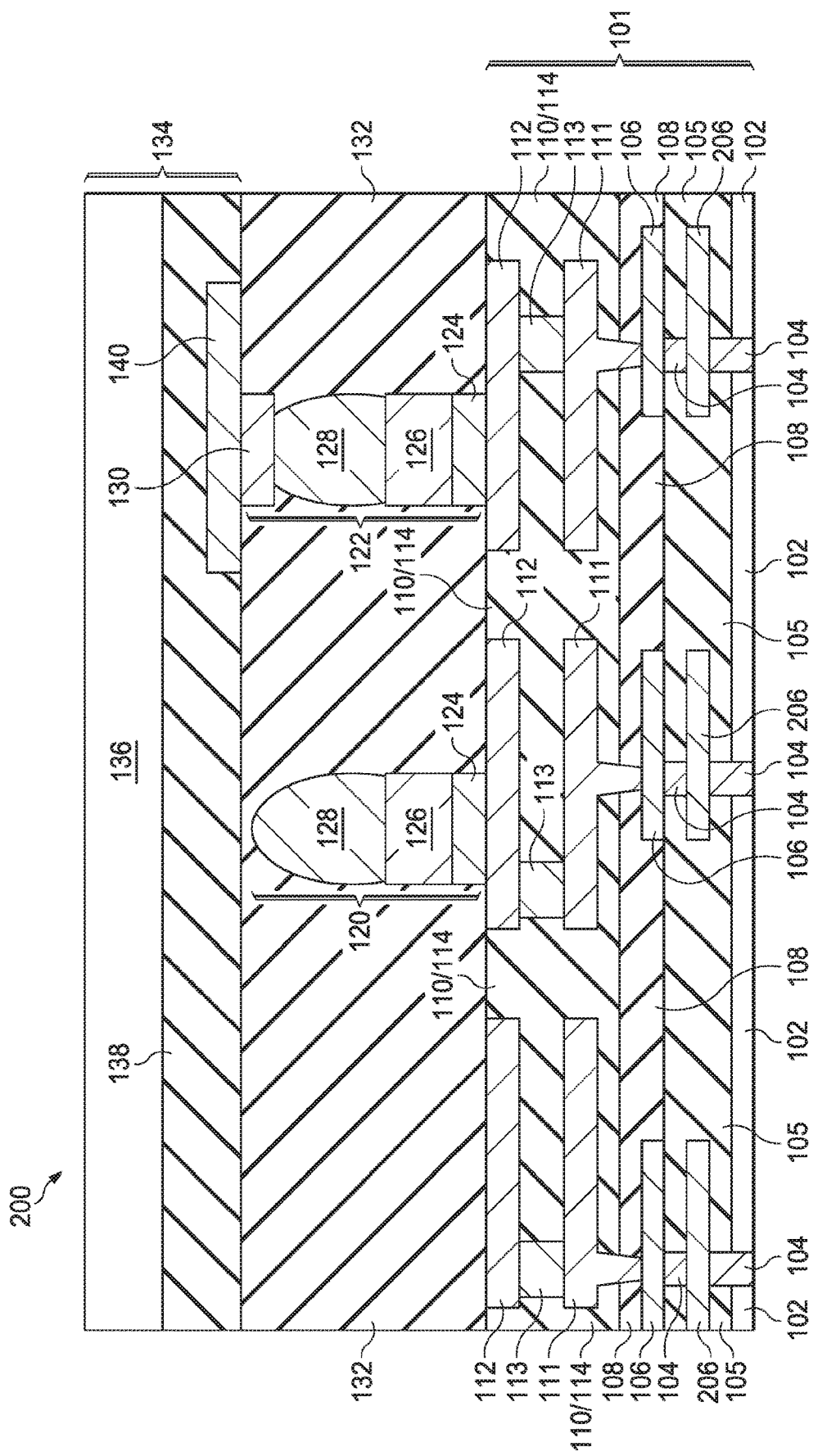
FIG. 2A is another exemplary integrated circuit package that may include an exemplary filter and/or capacitor according to some embodiments.

FIG. 2A is another exemplary integrated circuit package 200 that may include an exemplary filter and/or capacitor according to some embodiments. The bottom die 101 includes a substrate 102, an insulator layer 110/114 which represents the insulator layers 110 and 114 in FIG. 1A, and a first and a second (multiple) redistribution layers (RDL's) 111 and 112 in the insulator layer 110/114, connected by vias 113 in some embodiments. Metal layers 106 and 206 are shown with vias (or through via) 104 for electrical connections in the bottom die 101.

The dielectric layer 105 can be inter-layer dielectric (ILD) or inter-metal dielectric (IMD) in between metal layers/via layers. A micro-bump layer comprises micro-bump lines 120 and 122. Micro-bump lines 120 and 122 may be formed above the bottom die 101 and connected to the RDL 112 in some embodiments. An underfill 132 may surround the micro-bump lines 120 and 122.

There may be a top die 134 placed above the bottom die 101, the micro-bump lines 120 and 122, and the underfill 132, connected to the micro-bump line 122 by a connector 130. The top die 134 may also comprise a substrate 136, an insulator layer 138, a third RDL 140 within the insulator layer 138, and metal layers (not shown) in the top die 134 similar to metal layers 106 and 206 in the bottom die 101. An underfill 132 may surround the micro-bump lines 120 and 122.

The micro-bump lines 120 and 122 are connected to the first RDL 112 and the second RDL 111 (by via 113) in the bottom die 101. The micro-bump line 122 is connected to the third RDL 140 in the top die 134. Any combination of the micro-bump lines 120 and 122, the first RDL 112 and the second RDL 111 in the bottom die 101, metal lines 106 and 206 in the bottom die 101, the third RDL 140 in the top die 134, and metal layers (not shown) in the top die 134, can be used as parts of the filter 150 in FIG. 1B. Other parts of the embodiment shown in FIG. 2A are similar to the corresponding components as described in FIG. 1A.

By using the RDL 111 and/or 112, or micro bump line 120 and/or 122 to implement a filter or a capacitor, the filter or the capacitor can have the lower resistance from the thicker layer(s), compared to a thinner metal layer in the die. Also, no chip area or reduced chip area in the die (e.g., below RDL 111) is used to implement the filter or the capacitor. Examples are described below with performance comparison in FIG. 3 and FIG. 5A.

FIG. 2B is a cross section of an exemplary filter strip 144a or 144b in FIG. 2A that may be implemented in the exemplary integrated circuit package in FIG. 2A. For example, the filter strip 144a in FIG. 1B can have the cross section 201 and the filter strip 114b in FIG. 1B can have the cross section 203. In some embodiments of filter 150 in FIG. 1B having the cross sections 201 and/or 203, the upper layer 210 can be implemented using the first RDL 112 and the lower layer 214 can be implemented using the second RDL 111, while the connect layer 212 can be implemented using the via 113.

In another example, the upper layer 210 can be implemented using the third RDL 140 and the lower layer 214 can be implemented using the first RDL 112, while the connect layer 212 can be implemented using the micro bump line 122. In yet another example, the upper layer 210 can be implemented using the second RDL 111 and the lower layer 214 can be implemented using the top metal layer 106 in the bottom die 101, while the connect layer 212 can be implemented by the portion of the second RDL 111 connecting to the top metal layer 106.

In other embodiments, multiple RDL layers such as 111 and 112 can be used as the upper layer 210 and multiple metal layers such as 106 and 206 in the bottom die 101 can be used as the lower layer 214. The size or number of elements such as vias 113 and 104 can be different from the exemplary figures shown.

Figure 3:
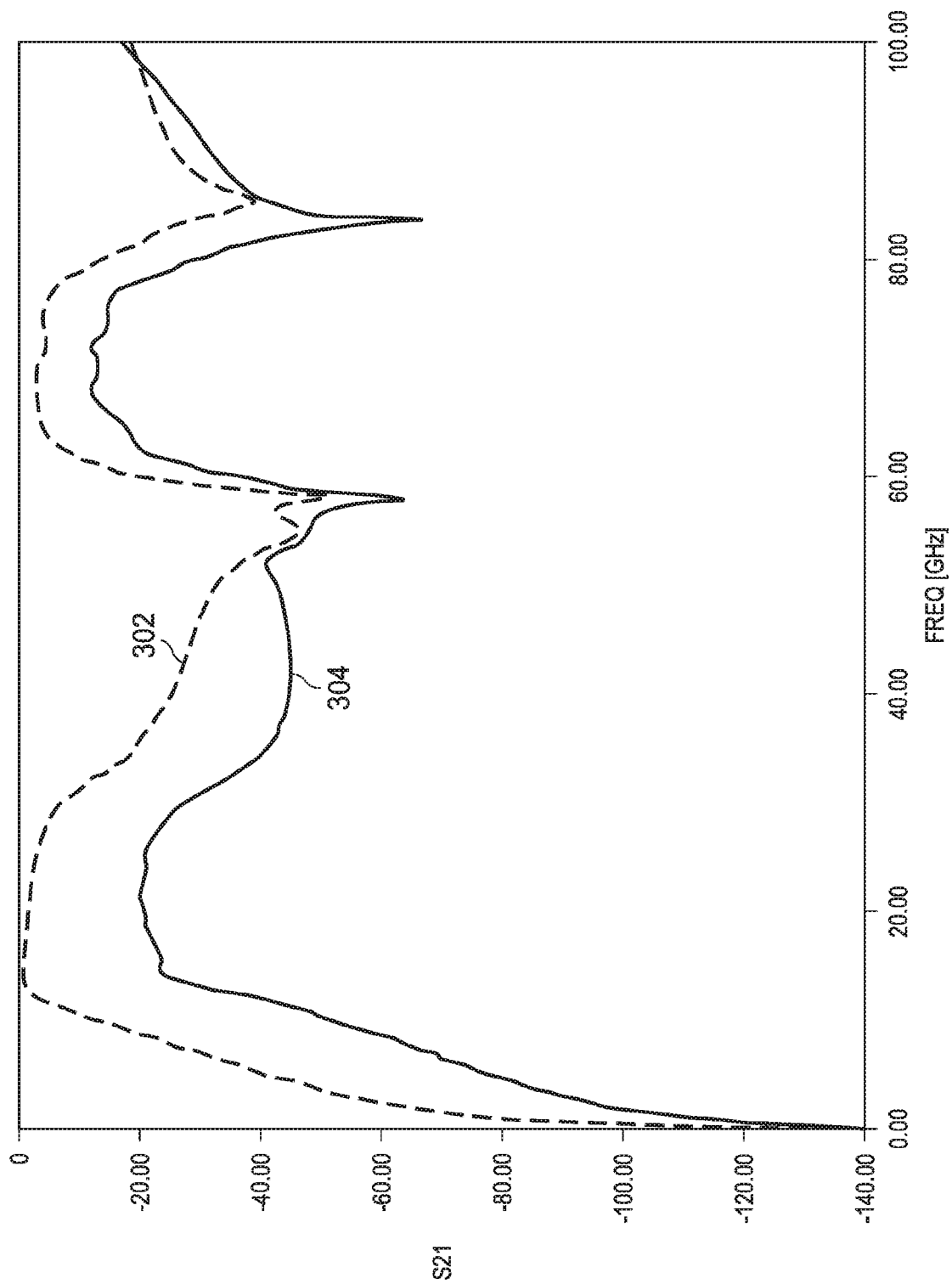
FIG. 3 is a plot of forward gain S21 of the exemplary filter in FIG. 1B implemented in the integrated circuit package in FIG. 1A or FIG. 2A compared to a conventional filter.

FIG. 3 is a plot of forward gain S21 of the exemplary filter 150 in FIG. 1B implemented in the integrated circuit package in FIG. 1A or FIG. 2A compared to a conventional filter. In some embodiments, the filter 150 has the RDL 112 thickness ranging from 1 µm to 10 µm, and the micro bump layer including the micro bump line 120 and/or 122 has a thickness ranging from 20 µm to 50 µm.

In one exemplary filter 150 using the RDL 112 with a thickness of 1.45 µm and the micro bump line 120 with a thickness of 23.55 µm, the S21 parameter plot 302 showed about 20 dB improvements at 10 GHz-40 GHz frequency range, compared to a conventional filter plot 304 using a 3 µm thickness metal line inside a chip having the same filter area. The exemplary filter 150 had a total area of about 670 µm×1250 µm with about 40 µm strip width and 50 µm spacing in between the strips 142, 144a, and 144b. For the conventional filter to have a similar S21 performance, it may occupy about 2 to 5 times larger chip area (e.g., below RDL 112) than the exemplary filter 150 using the RDL 112 and/or the micro bump layer including the micro bump line 120.

FIGS. 4A-4D are exemplary filter layouts that can be implemented in the exemplary integrated circuit package in FIG. 1A or FIG. 2A. By using any of the RDL 111 and 112, and micro bump line 120 and 122 to implement a filter, the filter can have the lower resistance from the thicker layer(s), compared to a thinner metal layer in the die. Also, there is less parasitic capacitance for the filter because the RDL 111 and 112 or the micro bump line 120 and 122 are further away from the substrate such as 102 of the lower die 101. The lower resistance and lower parasitic capacitor result in an improved forward gain S21 of the filter. Also, no chip area or reduced chip area in the die (e.g., below RDL in the bottom die) is used to implement the filter. Examples are described with performance comparison in FIG. 3 above.

Figure 4A:
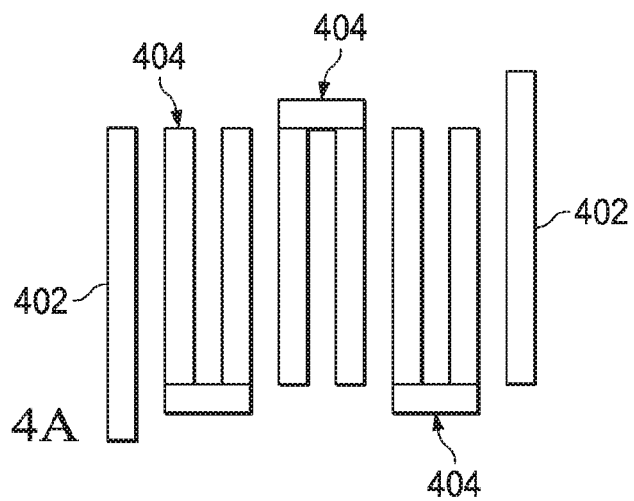
FIGS. 4A-4D are exemplary filter layouts that can be implemented in the exemplary integrated circuit package in FIG. 1A or FIG. 2A.

FIG. 4A is an exemplary inter-digital filter with port strips 402 and middle strips 404. The implementation of the inter-digital filter in FIG. 4A can be achieved similar to the comb line filter in FIG. 1B as described above using any combination of RDL's 111 and 112 in the bottom die 101, metal layers 106 and 206 in the bottom die 101, micro bump lines 120 and 122 in the micro bump layer between the bottom die 101 and the top die 134, RDL 140 in the top die 134, and metal layers (not shown) in the top die 134 in FIGS. 1A and 2A, similar to the filter in FIGS. 1B and/or 2B as described above.

Figure 4B:
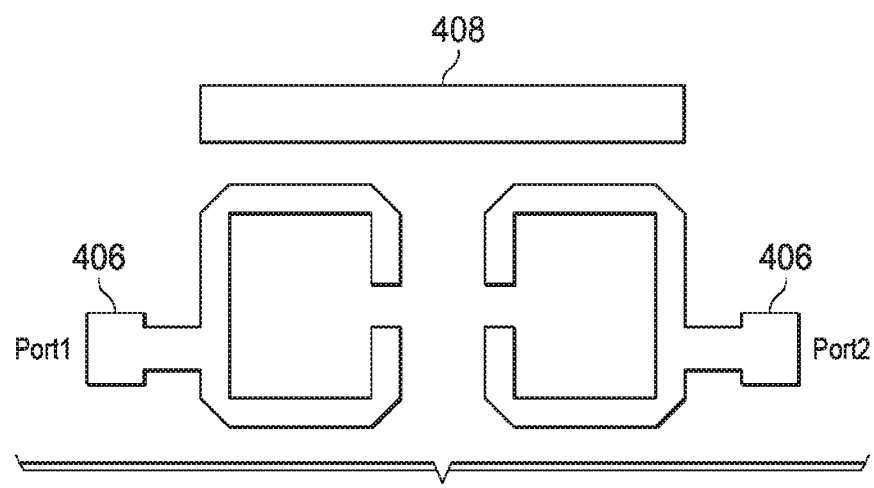

FIG. 4B is an exemplary open loop filter layout that can be implemented in the exemplary integrated circuit package in FIG. 1A or FIG. 2A. The open loop filter in FIG. 4B includes open loop ports 406 and a ground strip 408. The open loop ports 406 and a ground strip 408 can be implemented using any combination of RDL's 111 and 112 in the bottom die 101, metal layers 106 and 206 in the bottom die 101, micro bump lines 120 and 122 in the micro bump layer between the bottom die 101 and the top die 134, RDL 140 in the top die 134, and metal layers (not shown) in the top die 134 in FIGS. 1A and 2A, similar to the filter in FIGS. 1B and/or 2B as described above.

In some embodiments, the width of the open loop filter is about 0.5 mm to 3 mm when using a single layer such as RDL 112 or micro bump line 120. If multiple layers such as RDL's 111 and 112 connected by vias 113, or the micro bump 120 and the RDL 112 are used, the size can be reduced. The ground strip 408 can be connected to a ground voltage using vias (or through vias) 104 and/or 113 in some embodiments.

Figure 4C:
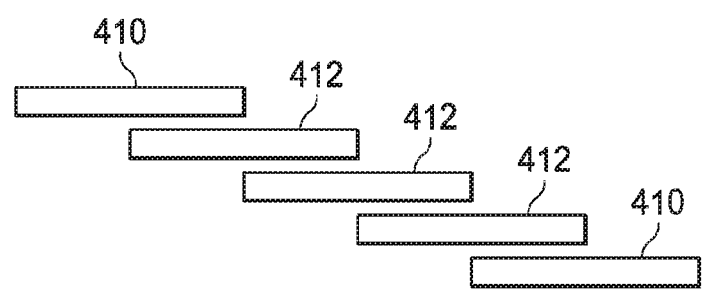

FIG. 4C is an exemplary parallel-coupled line filter layout that can be implemented in the exemplary integrated circuit package in FIG. 1A or FIG. 2A. The parallel-coupled line filter in FIG. 4C includes port strips 410 and middle strips 412. The port strips 410 and middle strips 412 can be implemented using any combination of RDL's 111 and 112 in the bottom die 101, metal layers 106 and 206 in the bottom die 101, micro bump lines 120 and 122 in the micro bump layer between the bottom die 101 and the top die 134, RDL 140 in the top die 134, and metal layers (not shown) in the top die 134 in FIGS. 1A and 2A, similar to the filter in FIGS. 1B and/or 2B as described above.

Figure 4D:
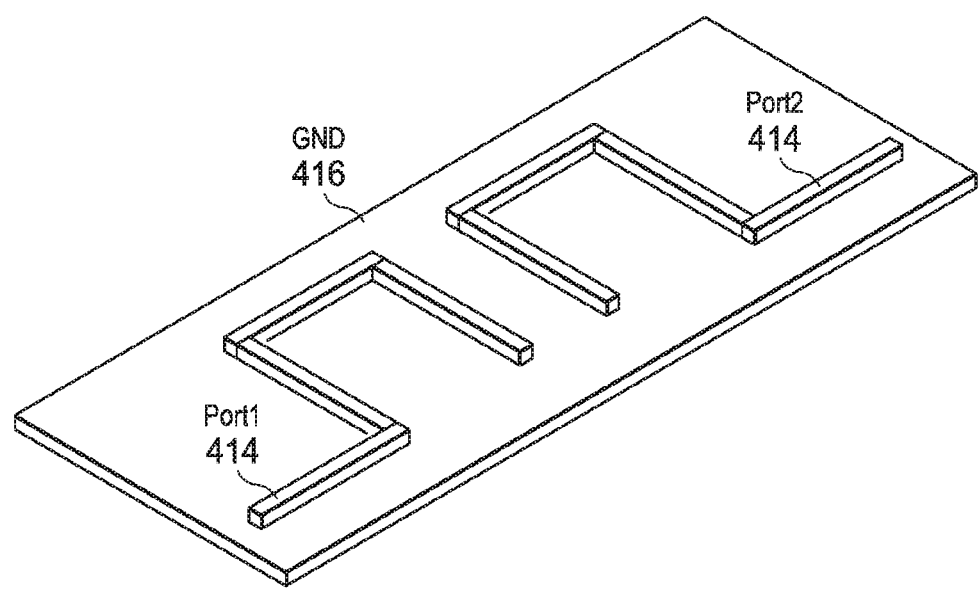

FIG. 4D is an exemplary micro-strip filter layout that can be implemented in the exemplary integrated circuit package in FIG. 1A or FIG. 2A. The micro-strip filter in FIG. 4D includes port strips 414 and a ground plane 416. The port strips 414 and the ground plane 416 can be implemented using any combination of RDL's 111 and 112 in the bottom die 101, metal layers 106 and 206 in the bottom die 101, micro bump lines 120 and 122 in the micro bump layer between the bottom die 101 and the top die 134, RDL 140 in the top die 134, and metal layers (not shown) in the top die 134 in FIGS. 1A and 2A, similar to the filter in FIGS. 1B and/or 2B as described above.

For example, the port strips 414 can be implemented with the RDL 112 and the micro bump line 120 and the ground plane 416 can be implemented in the metal layer 106 (not connected to each other). In some examples, the size of the micro-strip filter in FIG. 4D is about 0.5 mm to 5 mm on each side.

Figure 5A:
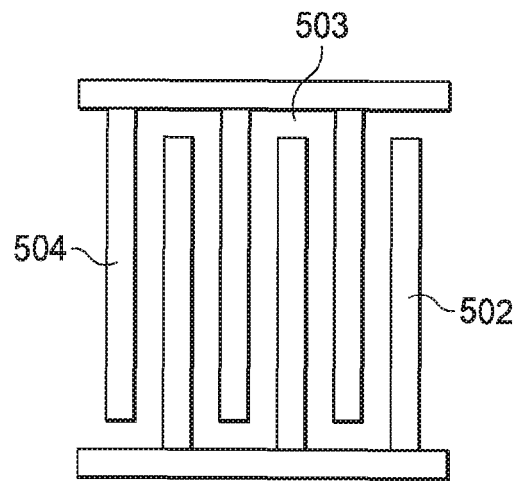
FIGS. 5A-5C are exemplary layouts and FIG. 5D is a cross section of capacitors that can be implemented in the exemplary integrated circuit package in FIG. 1A or FIG. 2A.
Figure 5B:
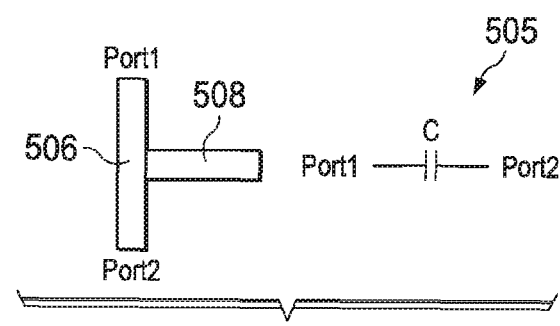
Figure 5C:
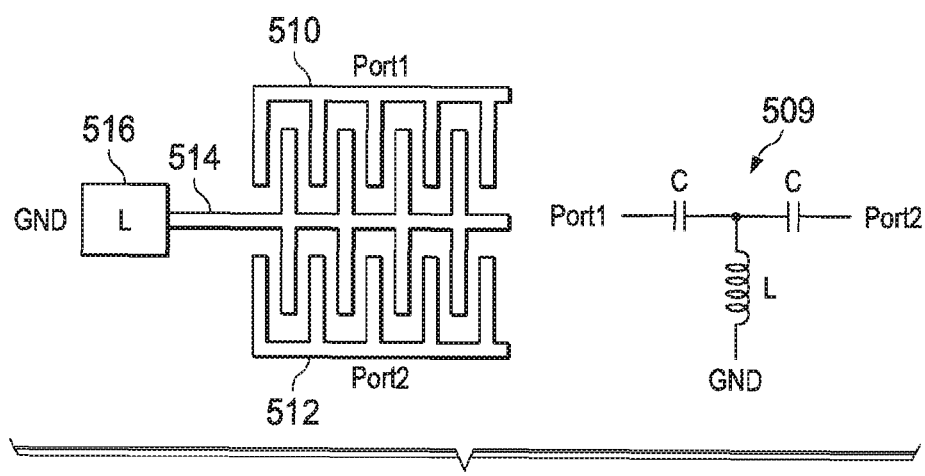
Figure 5D:
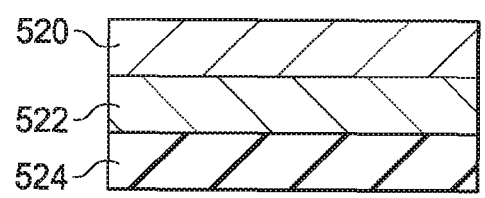

FIGS. 5A-5C are exemplary layouts and FIG. 5D is a cross section of capacitors that may be implemented in the exemplary integrated circuit package in FIG. 1A or FIG. 2A. By using the RDL 111 and/or 112, or micro bump line 120 and/or 122 to implement a capacitor, the capacitor can have the lower resistance from the thicker layer(s), compared to a thinner metal layer in the die. This results in an improved Q factor value for the capacitor. Also, no chip area or reduced chip area in the die (e.g., below RDL in the bottom die) is used to implement the capacitor. Examples are described below with performance comparison in FIG. 5A below.

FIG. 5A is an exemplary capacitor layout that can be implemented in the exemplary integrated circuit package in FIG. 1A or FIG. 2A. The capacitor in FIG. 5A includes a first electrode 502 and a second electrode 504 separated by insulator 503 (e.g., a dielectric layer or an insulator layer). The first electrode 502 and the second electrode 504 can be implemented using any combination of RDL's 111 and 112 in the bottom die 101, metal layers 106 and 206 in the bottom die 101, micro bump lines 120 and 122 in the micro bump layer between the bottom die 101 and the top die 134, RDL 140 in the top die 134, and metal layers (not shown) in the top die 134 in FIGS. 1A and 2A, similar to the filter in FIGS. 1B and/or 2B as described above.

For example, the first electrode 502 and the second electrode 504 can be implemented on the RDL 112, separated by the insulator layer 114 filled in between. In another example, the first electrode 502 and the second electrode 504 can be implemented using the RDL 112 and the micro bump line 120 in the micro bump layer, separated by the insulator layer 114 and underfill 132 filled in between.

In one example, a capacitor using the RDL 112 with a thickness of 1.45 μm and the micro bump line 120 with a thickness of 23.55 μm, the Q factor showed about 9-10 times improvement, compared to a conventional capacitor implemented inside a chip having a similar capacitance. This results from reduced resistance from the thicker metal layer of the exemplary capacitor.

FIG. 5B is another exemplary layout of a capacitor. In FIG. 5B, a capacitance in a transmission line strip 506 from port 1 to port 2 is implemented by the open stub strip 508. This can be used for impedance matching in a RLC network, for example. The open stub strip 508 can have a length of ¼ of the operating wavelength, and the strip between ports and port can be around 0.1 mm to 5 mm in some embodiments. An equivalent circuit 505 is shown for a reference.

The transmission line strip 506 and the open stub strip 508 can be implemented using any combination of RDL's 111 and 112 in the bottom die 101, metal layers 106 and 206 in the bottom die 101, micro bump lines 120 and 122 in the micro bump layer between the bottom die 101 and the top die 134, RDL 140 in the top die 134, and metal layers (not shown) in the top die 134 in FIGS. 1A and 2A, similar to the filter in FIGS. 1B and/or 2B as described above.

FIG. 5C is another exemplary layout of a capacitor. In FIG. 5C, two capacitors C and an inductor L (with an equivalent circuit 509) are shown with a first finger strip 510, a second finger strip 512, and a middle strip 514 connected to an inductor 516. The inductor 516 can be implemented by any known layout design known in the art and can be implemented in the same layer as the first finger strip 510, the second finger strip 512, and a middle strip 514, or in a different layer.

The first finger strip 510, the second finger strip 512, and a middle strip 514, and the inductor 516 can be implemented using any combination of RDL's 111 and 112 in the bottom die 101, metal layers 106 and 206 in the bottom die 101, micro bump lines 120 and 122 in the micro bump layer between the bottom die 101 and the top die 134, RDL 140 in the top die 134, and metal layers (not shown) in the top die 134 in FIGS. 1A and 2A, similar to the filter in FIGS. 1B and/or 2B as described above.

FIG. 5D is a cross section of a planar capacitor. In FIG. 5D, the capacitor can be implemented in separate multiple layers similar to a metal-oxide-metal capacitor implemented inside a die (or chip). For example, the first RDL layer 112 can be used for a first electrode 520 and the second RDL 111 can be used for the second electrode 524 of the capacitor, and the insulator layer 110/114 can be used (without the connecting via 113) for the insulator layer 522 in between the first electrode 520 and the second electrode 524. In this case, the first electrode 520 and the second electrode 524 of the capacitor are implemented in separate electrically conductive layers, and each electrode can have any shape such as rectangular, oval, or any other shape in a top view.

According to some embodiments, an integrated circuit package includes a die. An electrically conductive layer comprises a redistribution layer (RDL) in the die, or a micro-bump layer above the die, or both. The micro bump layer comprises at least one micro-bump line. A filter comprises the electrically conductive layer. A capacitor comprises an electrode formed in the electrically conductive layer.

According to some embodiments, a method of forming an integrated circuit package includes providing a die comprising a redistribution layer (RDL). At least one micro-bump line is formed over the RDL. A filter or a capacitor comprising the RDL, or the at least one micro-bump line, or both, is formed. The method of claim 18, wherein forming the at least one micro-bump line comprises forming a copper layer over the first RDL, forming a solder layer above the layer of copper, and reflowing the solder layer. In various embodiments, a second die is provided. The second die comprises a second RDL. The second die is mounted over the at least one micro-bump line. The filter or the capacitor further comprises the second RDL in the second die.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A semiconductor device comprising:
   a first micro-bump line electrically interposed between a first contact on a first die and a second contact on a second die;

a second micro-bump line electrically coupled to the first die; and an underfill interposed between the first die and the second die, the underfill completely separating the second micro-bump line from all electrical components other than the first die.

2. The semiconductor device of claim 1, wherein the first die comprises a first redistribution line, wherein the first micro-bump line is directly on the first redistribution line.

3. The semiconductor device of claim 1, wherein the first die comprises a first redistribution line and an under-bump metallization, wherein the first micro-bump line is directly on the under-bump metallization.

4. The semiconductor device of claim 1, wherein the first micro-bump line and the second micro-bump line each comprise a metal line and a reflowable material on the metal line.

5. The semiconductor device of claim 4, wherein the metal line comprises a first metal material and a second metal material, the second metal material being interposed between the first metal materials and the reflowable material, the first metal material being a different material than the second metal material.

6. The semiconductor device of claim 1, further comprising a first redistribution line and a second redistribution line electrically coupled to the first redistribution line, the second redistribution line being interposed between the first redistribution line and the second micro-bump line, wherein the first redistribution line and the second redistribution line has a same pattern in a plan view.

7. A semiconductor device comprising:
a first substrate having a first contact;
a second substrate having a second contact and a third contact;
a first micro-bump line interposed directly between the first substrate and the second substrate along a first line perpendicular to a major surface of the first substrate, the first micro-bump line electrically coupling the first contact to the second contact; and
a second micro-bump line interposed directly between the first substrate and the second substrate along a second line perpendicular to a major surface of the first substrate, the second micro-bump line electrically coupled to the third contact, wherein the second micro-bump line is not electrically interposed between the first substrate and the second substrate.

8. The semiconductor device of claim 7, further comprising an underfill interposed between the first substrate and the second substrate, the underfill being interposed between the second micro-bump line and the first substrate.

9. The semiconductor device of claim 7, wherein the first micro-bump line and the second micro-bump line each comprise a metal line and a solder line, wherein the solder line is interposed between the metal line and the first substrate.

10. The semiconductor device of claim 9, wherein the metal line comprises a first metal line and a second metal line interposed between the first metal line and the second substrate.

11. The semiconductor device of claim 10, wherein the first metal line comprises nickel and the second metal line comprises copper.

12. The semiconductor device of claim 7, wherein the second substrate comprises a passivation layer overlying the second contact and the third contact and an underbump metallization extending through the passivation layer, wherein the underbump metallization is interposed between the first micro-bump line and the second contact.

13. The semiconductor device of claim 12, wherein the first micro-bump line extends closer to the second contact than an outermost surface of the passivation layer.

14. A semiconductor device comprising:
a first substrate having a first contact;
a second substrate having a second contact bonded to the first contact of the first substrate, the second contact being bonded to the first contact by a first micro-bump line, the first micro-bump line comprising a first metal line and a first reflowable line, the first metal line being interposed between the first reflowable line and the second contact, the second substrate comprising a third contact; and
a second micro-bump line bonded to the third contact of the second substrate, the second micro-bump line comprising a second metal line and a second reflowable line, the second metal line being interposed between the second reflowable line and the third contact, the second metal line being spaced apart from the first substrate, the second micro-bump line being vertically within lateral boundaries of the first substrate.

15. The semiconductor device of claim 14, further comprising an insulating material completely separating the second micro-bump line and the first substrate.

16. The semiconductor device of claim 14, wherein the first micro-bump line and the second micro-bump line form a comb filter.

17. The semiconductor device of claim 14, wherein the first micro-bump line and the second micro-bump line form a interdigital filter.

18. The semiconductor device of claim 14, wherein the first micro-bump line and the second micro-bump line form an open-loop filter.

19. The semiconductor device of claim 14, wherein the first micro-bump line and the second micro-bump line form a parallel-coupled line filter.

20. The semiconductor device of claim 14, wherein the first micro-bump line and the second micro-bump line form a micro-strip filter.

* * * * *